United States Patent
Hiei (10) Patent No.: US 9,320,134 B2
(45) Date of Patent: Apr. 19, 2016

(54) DC-DC CONVERTER MODULE AND MULTI-LAYER SUBSTRATE

(71) Applicant: Murata Manufacturing Co., Ltd., Nagaokakyo-shi, Kyoto-fu (JP)

(72) Inventor: Tomoyoshi Hiei, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 534 days.

(21) Appl. No.: 13/792,472

(22) Filed: Mar. 11, 2013

(65) Prior Publication Data

US 2013/0187480 A1 Jul. 25, 2013

Related U.S. Application Data

(63) Continuation of application No. PCT/JP2011/069688, filed on Aug. 31, 2011.

(30) Foreign Application Priority Data

Jan. 25, 2011 (JP) .................. 2011-013029

(51) Int. Cl.
*B23K 11/24* (2006.01)
*H05K 1/02* (2006.01)
(Continued)

(52) U.S. Cl.
CPC ............... *H05K 1/0233* (2013.01); *H02M 1/44* (2013.01); *H02M 3/04* (2013.01); *H02M 3/158* (2013.01);
(Continued)

(58) Field of Classification Search
CPC ............. H02M 2001/0006; H02M 2001/0032; H02M 3/158; H02M 1/081; H02M 1/126; H02M 1/32; H02M 1/44; H02M 2001/0048; H02M 2001/123; H02M 2003/1555; H02M 3/04; H02M 5/2573; H02M 5/4585; H02M 7/02

USPC ............................................ 307/112; 361/782
See application file for complete search history.

(56) References Cited

U.S. PATENT DOCUMENTS 7,432,580 B2 * 10/2008 Sato ..................... H01L 25/16 257/516
7,889,520 B2 * 2/2011 Moiseev .................. H01F 3/14 336/178

(Continued)

FOREIGN PATENT DOCUMENTS

JP 3365622 B2 1/2003
JP 2005-183890 A 7/2005
(Continued)

OTHER PUBLICATIONS

Official Communication issued in International Patent Application No. PCT/JP2011/069688, mailed on Nov. 22, 2011.
(Continued)

*Primary Examiner* — Jared Fureman
*Assistant Examiner* — Esayas Yeshaw
(74) *Attorney, Agent, or Firm* — Keating & Bennett, LLP (57) ABSTRACT

A DC-DC converter module includes a multi-layer substrate, a switching IC, and a coil. The multi-layer substrate includes component mounting electrodes provided on the top surface and an input terminal, an output terminal, and ground terminals provided on the bottom surface. The switching IC switches an input voltage and includes an input electrode, an output electrode, and a ground electrode, and is mounted on the top surface of the substrate by connecting the electrodes to the component mounting electrodes. The coil is arranged within the multi-layer substrate in a spiral shape with an axis extending in the substrate stacking direction. The bottom surface side end of the coil is connected to the input/output electrode of the switching IC.

19 Claims, 5 Drawing Sheets

(51) Int. Cl.
*H02M 3/158* (2006.01)
*H05K 1/16* (2006.01)
*H02M 3/04* (2006.01)
*H02M 1/44* (2007.01)
*H01F 37/00* (2006.01)

(52) U.S. Cl.
CPC .............. *H05K 1/165* (2013.01); *H01F 37/005* (2013.01); *H01L 2224/16225* (2013.01); *H01L 2224/16235* (2013.01); *H01L 2924/15313* (2013.01); *H01L 2924/19105* (2013.01); *Y10T 307/74* (2015.04)

(56) References Cited

U.S. PATENT DOCUMENTS

| | | | |
|---|---|---|---|
| 2005/0230812 | A1 | 10/2005 | Przadka |
| 2006/0214221 | A1* | 9/2006 | Challa ................. H01L 21/3065 |
| | | | 257/328 |
| 2007/0063679 | A1* | 3/2007 | Weng ................. H02M 3/1584 |
| | | | 323/225 |
| 2008/0309442 | A1* | 12/2008 | Hebert .................. H01F 27/292 |
| | | | 336/65 |
| 2009/0068426 | A1 | 3/2009 | Nishizawa |
| 2009/0103272 | A1* | 4/2009 | Watanabe ............ H01F 27/292 |
| | | | 361/748 |
| 2009/0201005 | A1 | 8/2009 | Noma et al. |
| 2012/0068550 | A1* | 3/2012 | Boer ....................... H02J 7/025 |
| | | | 307/104 |

FOREIGN PATENT DOCUMENTS

| | | |
|---|---|---|
| JP | 2005-531138 A | 10/2005 |
| JP | 2006-042538 A | 2/2006 |
| JP | 2006-228960 A | 8/2006 |
| JP | 4202902 B2 | 12/2008 |
| JP | 4325747 B2 | 9/2009 |
| WO | 20071145189 A1 | 12/2007 |

OTHER PUBLICATIONS

Official Communication issued in corresponding Chinese Patent Application No. 201180042371.0, mailed on Sep. 29, 2014.

* cited by examiner

DC-DC CONVERTER MODULE AND MULTI-LAYER SUBSTRATE

BACKGROUND OF THE INVENTION

1. Field of the Invention

The present invention relates to DC-DC converter modules including a DC-DC converter provided on a multi-layer substrate, and multi-layer substrates.

2. Description of the Related Art

Power supply circuits for portable devices use a linear regulator type or switching regulator type ultra compact regulator module. A linear regulator type module has a low voltage conversion efficiency since all the voltage variation components are converted into heat, and a switching regulator type module has inferior noise characteristics due to switching noise or the like. Hence, it is desired that a DC-DC converter that has a high voltage conversion efficiency and good noise characteristics be reduced in size so as to be usable in a power supply circuit of a portable device or the like.

To reduce the size of a DC-DC converter, the DC-DC converter may be formed in a multi-layer substrate including a magnetic body therein (refer to, for example, Japanese Unexamined Patent Application Publication No. 2006-42538 and Japanese Patent No. 4325747).

Figure 1:
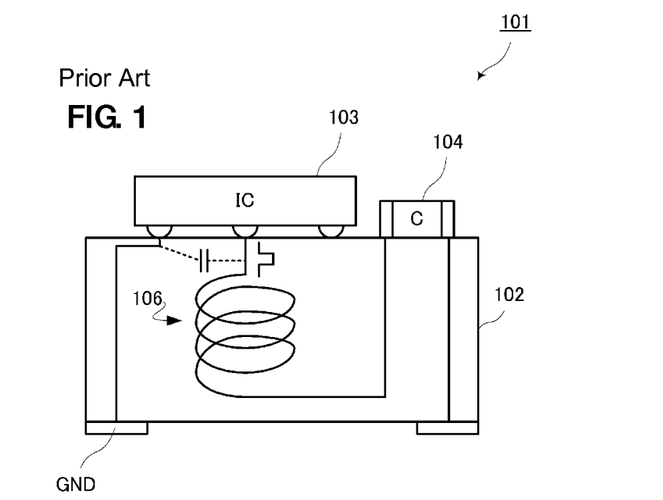
FIG. 1 is a cross-sectional schematic view of a DC-DC converter module of an existing configuration.

FIG. 1 is a diagram illustrating an existing configuration of a DC-DC converter module. A DC-DC converter module 101 includes a magnetic substrate 102, a switching IC 103, and a capacitor component 104. The bottom surface of the magnetic substrate 102 has input/output terminals (not illustrated) and a ground terminal GND formed thereon and the top surface has the switching IC 103 and the capacitor component 104 mounted thereon. The substrate has a coil 106 formed therein.

In the existing DC-DC converter module, a wiring line that connects the ground electrode connected to the ground potential of a board on which the module is mounted to the switching IC mounted on the module also extends through the magnetic substrate. Hence, the impedance of the wiring line becomes high and the potential of the ground port of the switching IC is likely to be different from the actual ground potential.

In addition, since a wiring line between the switching IC and a coil through which a saw tooth or pulse current flows is near the ground port of the switching IC, the wiring line and the ground port are coupled to each other, causing noise transmission. Hence, the potential of the ground port may vary significantly, resulting in a high noise level in the converter output.

SUMMARY OF THE INVENTION

Hence, preferred embodiments of the present invention provide a DC-DC converter module having significantly improved noise characteristics and a multi-layer substrate used in such a DC-DC converter module.

A DC-DC converter module according to a preferred embodiment of the present invention includes a multi-layer substrate, a switching IC, and a coil. The multi-layer substrate includes component mounting electrodes provided on a first surface in a substrate stacking direction and an input terminal, an output terminal, and a ground terminal provided on a second surface in the substrate stacking direction. The switching IC switches an input voltage and outputs the switched voltage, and includes an input electrode that is connected to the input terminal through the component mounting electrode, an output electrode that is connected to the output terminal through the component mounting electrode, and a ground electrode that is connected to the ground terminal through the component mounting electrode. The coil is arranged within the multi-layer substrate in a spiral shape with an axis extending in the substrate stacking direction. An end of the coil nearer to the first surface is connected to the input terminal or the output terminal, and an end of the coil nearer to the second surface is connected to the input electrode or the output electrode of the switching IC.

With this configuration, since the end of the coil nearer to the second surface is connected to the input electrode or the output electrode of the switching IC, a wiring line between the coil and the switching IC is located close to the ground terminal on the second surface side of the multi-layer substrate such that the wiring line and the ground terminal are directly coupled to each other. As a result, the effect of the wiring impedance of the wiring line which is a common impedance for noise is suppressed and significantly reduced, and noise transmitted over the wiring line is suppressed and significantly reduced. As a result, the noise level of a converter output is significantly reduced.

In the DC-DC converter module described above, when a shield layer that includes a ground electrode and that is connected to the ground terminal is provided between the first surface and layers on which the coil is provided, the noise level of the converter output is further reduced.

In the DC-DC converter module described above, when the multi-layer substrate includes a magnetic layer, the sizes of the coil and the module can be reduced. In this case, since the wiring impedance between the switching IC and the ground terminal is increased, the effect of noise reduction due to suppression of the effect of the common impedance is further increased.

In the DC-DC converter module described above, by providing a capacitor mounted on the component mounting electrode, a first end of the capacitor may be connected to the end of the coil nearer to the first surface and a second end of the capacitor may be connected to the ground terminal.

A multi-layer substrate according to a preferred embodiment of the present invention is preferably formed by providing, on a first surface of the substrate in a substrate stacking direction, component mounting electrodes on which an input electrode, an output electrode, and a ground electrode of a switching IC are mounted, providing an input terminal, an output terminal, and a ground terminal on a second surface of the substrate in the substrate stacking direction, and providing, within the substrate, a coil having a spiral shape with an axis extending in the substrate stacking direction. An end of the coil nearer to the second surface is connected to the component mounting electrode to which the input electrode or the output electrode of the switching IC is connected.

According to various preferred embodiments of the present invention, since the end of the coil nearer to the second surface is connected to the input electrode or the output electrode of the switching IC, a wiring line between the coil and the switching IC is located close to the ground terminal on the second surface of the multi-layer substrate such that the wiring line and the ground terminal are directly coupled to each other. As a result, the effect of the wiring impedance of the wiring line which is a common impedance for noise is suppressed and significantly reduced, and noise transmitted over the wiring line is suppressed and significantly reduced, such that the noise level of a converter output is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 2A:
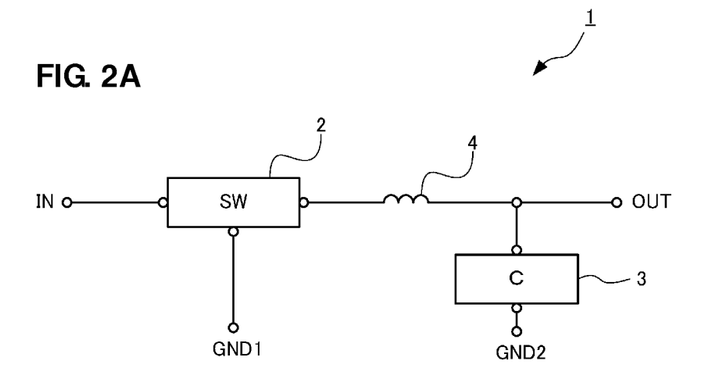
FIG. 2A is a circuit diagram of a DC-DC converter module according to a first preferred embodiment of the present invention.

FIG. 2A is a circuit diagram of a DC-DC converter module 1 according to a first preferred embodiment of the present invention.

The DC-DC converter module 1 includes a switching IC 2, a capacitor 3, and a coil 4, as circuit components, and includes an input terminal IN, an output terminal OUT, and ground terminals GND1 and GND2, as external terminals.

The input terminal IN is connected to an input electrode of the switching IC 2, the ground terminal GND1 is connected to a ground electrode of the switching IC 2, and the output terminal OUT is connected to an output terminal of the switching IC 2. A voltage input to the input terminal is switched by the switching IC 2 and output from the output electrode.

The coil 4 is connected in series between the output electrode of the switching IC 2 and the output terminal OUT. One end of the capacitor 3 is connected to a node between the coil 4 and the output terminal OUT and the other end is connected to the ground terminal GND2. The output of the switching IC 2 is smoothed by the coil 4 and the capacitor 3, and is output from the output terminal OUT.

Figure 2B:
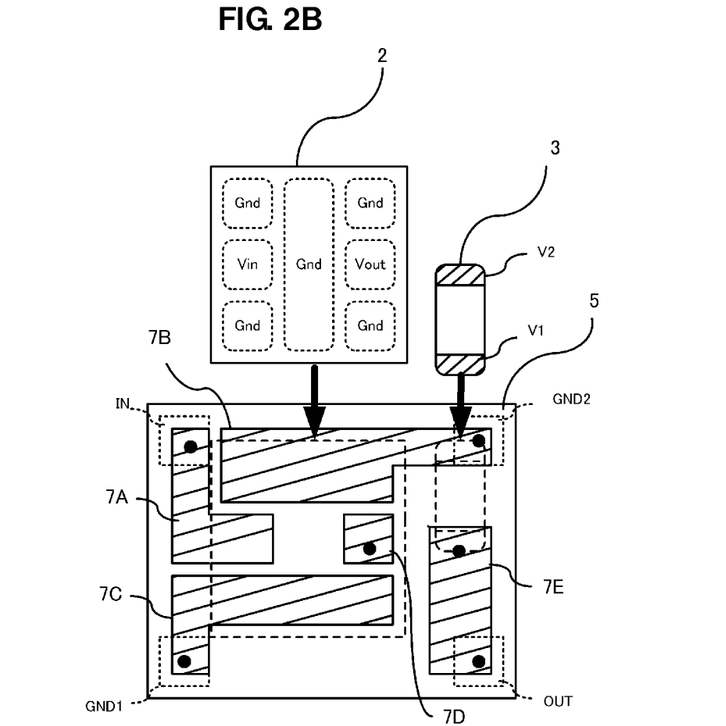
FIG. 2B is a top view of a DC-DC converter module according to the first preferred embodiment of the present invention.

FIG. 2B is a top view of the DC-DC converter module 1.

The DC-DC converter module 1 includes a multi-layer substrate 5. The multi-layer substrate 5 includes a plurality of magnetic layers stacked in a stacking direction which is perpendicular to the plane of FIG. 2B. The magnetic layers preferably are sheets formed of high-magnetic-permeability ferrite (such as Ni-Zi-Cu ferrite or Ni—Zn ferrite).

A plurality of component mounting electrodes 7A to 7E are provided on the top surface of the multi-layer substrate 5. The input terminal IN, the output terminal OUT, and the ground terminals GND1 and GND2 are provided on the bottom surface of the multi-layer substrate 5. Hence, the top surface of the multi-layer substrate 5 corresponds to the "first surface" described in the claims of the present invention and the bottom surface corresponds to the "second surface" described in the claims of the present invention. Note that the component mounting electrode 7A is connected to the input terminal IN, the component mounting electrode 7B is connected to the ground terminal GND2, the component mounting electrode 7C is connected to the ground terminal GND1, and the component mounting electrode 7E is connected to the output terminal OUT.

The switching IC 2 includes a plurality of ground electrodes Gnd, an input electrode Vin, and an output electrode Vout provided on the bottom surface thereof, and is mounted on the top surface of the multi-layer substrate 5. The plurality of ground electrodes Gnd are connected to the component mounting electrodes 7B and 7C, the input electrode Vin is connected to the component mounting electrode 7A, and the output electrode Vout is connected to the component mounting electrode 7D.

The capacitor 3 includes connection electrodes V1 and V2 at the respective ends thereof. The connection electrode V1 is connected to the component mounting electrode 7E and the connection electrode V2 is connected to the component mounting electrode 7B such that the capacitor 3 is mounted on the top surface of the multi-layer substrate 5.

Figure 2C:
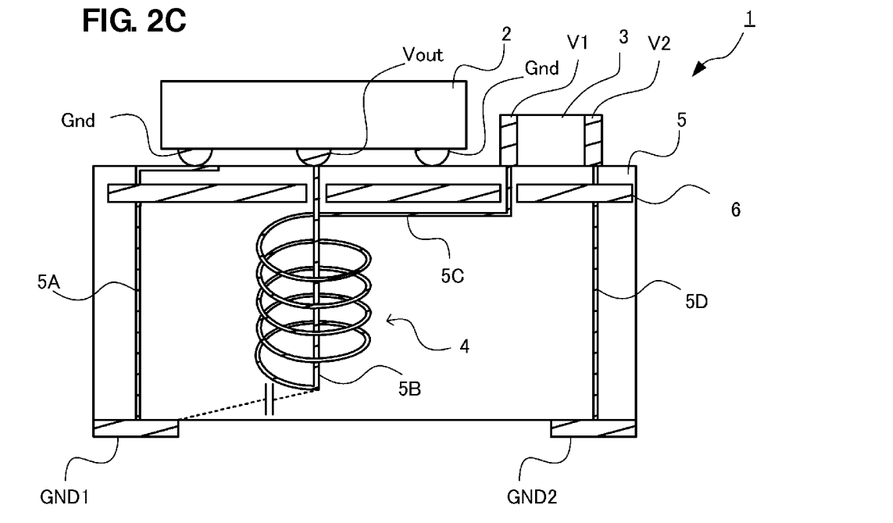
FIG. 2C is a schematic cross-sectional view of a DC-DC converter module according to the first preferred embodiment of the present invention.

FIG. 2C is a schematic cross-sectional view of the DC-DC converter module 1. Note that in this figure, the positional relationship among the components has been made to be slightly different from that in FIG. 2B to make the cross-sectional structure of the module easily understandable.

The multi-layer substrate 5 is provided therein with electrode patterns made of Ag or the like provided on the upper surfaces of the ferrite sheets and with via electrodes arranged so as to extend through the ferrite sheets, such that the spiral coil 4 defined by spiral electrode patterns connected together by the via electrodes, wiring lines 5A, 5B, 5C, and 5D to connect the components and terminals together, and a shield layer 6 are provided.

The wiring line 5A connects the ground terminal GND1 to the ground electrode Gnd of the switching IC 2. The wiring line 5B connects the output electrode Vout of the switching IC 2 to the bottom surface side end of the coil 4. The wiring line 5C connects the top surface side end of the coil 4 to the connection electrode V1 of the capacitor 3. The wiring line 5D connects the connection electrode V2 of the capacitor 3 to the ground terminal GND2. The shield layer 6 is provided on the top surface side, i.e., the first surface side, of the coil 4 in the multi-layer substrate 5 so as to be electrically connected to the wiring line 5A and the wiring line 5D.

Here, the wiring line 5B extends from the output electrode of the switching IC 2 through the coil plane of the coil 4 to near the bottom surface of the multi-layer substrate 5, where the wiring line 5B is connected to the bottom surface side end of the coil 4. As a result, the lower end of the wiring line 5B extends to near the ground terminal GND1 and, hence, the wiring line 5B is directly coupled to the ground terminal GND1. As a result, the effect of the wiring impedance of the wiring line 5A which is a common impedance for noise is suppressed and significantly reduced, and noise transmitted over the wiring line 5A is suppressed and significantly reduced, such that the noise characteristics of the DC-DC converter module 1 are significantly improved.

Figure 2D:
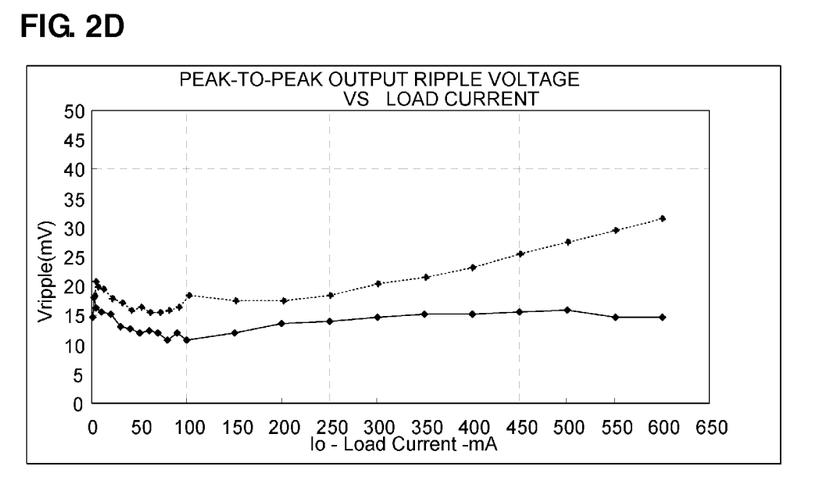
FIG. 2D is a diagram for explaining noise characteristics on the basis of a comparative test.

FIG. 2D is a diagram for explaining the noise characteristics improvement effect obtained by the DC-DC converter module 1 on the basis of a comparative test. In the comparative test, using a comparative configuration in which the connection targets of the top surface side end and the bottom surface side end of the coil are swapped around compared with the present preferred embodiment, the relationship between the load current and the ripple voltage was measured for the two configurations. In the figure, the horizontal axis represents load current and the vertical axis represents ripple voltage. The solid line corresponds to the present preferred embodiment and the dotted line corresponds to the comparative configuration, in the figure.

According to the comparative test, it is determined that the ripple voltage in the present preferred embodiment is lower than that in the existing configuration over the whole range of the horizontal axis, and the present preferred embodiment has good noise characteristics. In particular, although there is a tendency for the ripple voltage to increase with increasing load current in the existing configuration, such an increase in ripple voltage is not observed and stable noise characteristics with a low noise level are obtained in the present preferred embodiment.

Second Preferred Embodiment

Figure 3A:
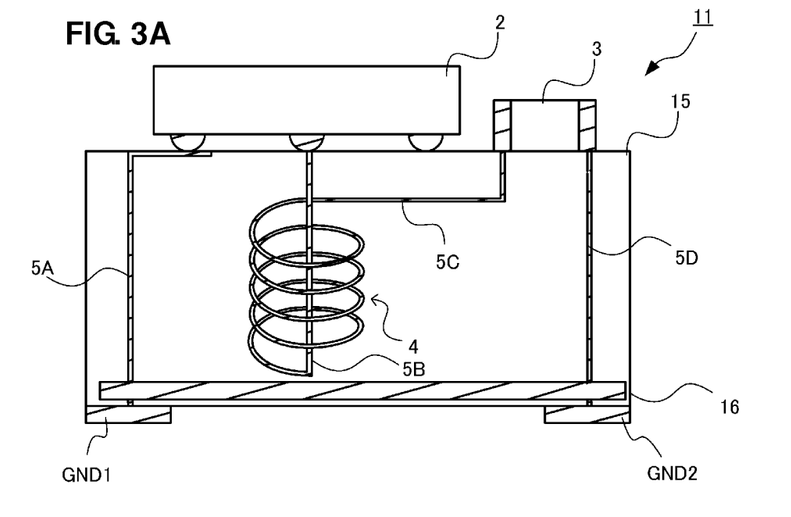
FIG. 3A is a schematic cross-sectional view of a DC-DC converter module according to a second preferred embodiment of the present invention.

FIG. 3A is a schematic cross-sectional view of a DC-DC converter module 11 according to a second preferred embodiment of the present invention. Unlike the first preferred embodiment, in the DC-DC converter module 11, a shield layer 16 is provided on the bottom surface side, i.e., the second surface side, of the layers where the coil 4 is located in a multi-layer substrate 15.

Figure 3B:
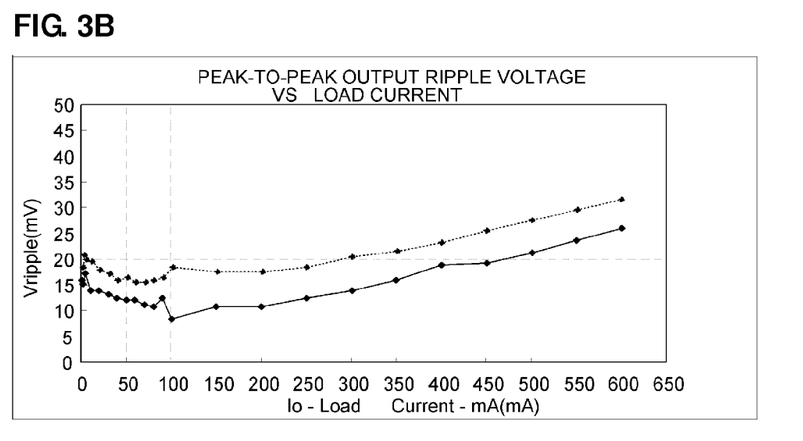
FIG. 3B is a diagram for explaining noise characteristics on the basis of a comparative test.

FIG. 3B is a diagram for explaining the noise characteristics improvement effect obtained by the DC-DC converter module 11 on the basis of a comparative test. In the comparative test, the relationship between the load current and the ripple voltage was measured for the present preferred embodiment and was compared with the relationship between the load current and the ripple voltage for the comparative configuration illustrated in FIG. 2C above. In the figure, the horizontal axis represents load current and the vertical axis represents ripple voltage. The solid line corresponds to the present preferred embodiment and the dotted line corresponds to the comparative configuration, in the figure.

According to the comparative test, it is determined that the ripple voltage in the present preferred embodiment is also lower than that in the existing configuration over the whole range of the horizontal axis, and the present preferred embodiment has good noise characteristics. However, in the present preferred embodiment, unlike the noise characteristics in the first preferred embodiment, there is a tendency for the ripple voltage to increase with increasing load current as in the existing configuration. Hence, it can be said that it is preferable to arrange the shield layer on the first surface side of the layers where the coil is located to obtain stable noise characteristics with a low noise level.

Third Preferred Embodiment

Figure 4:
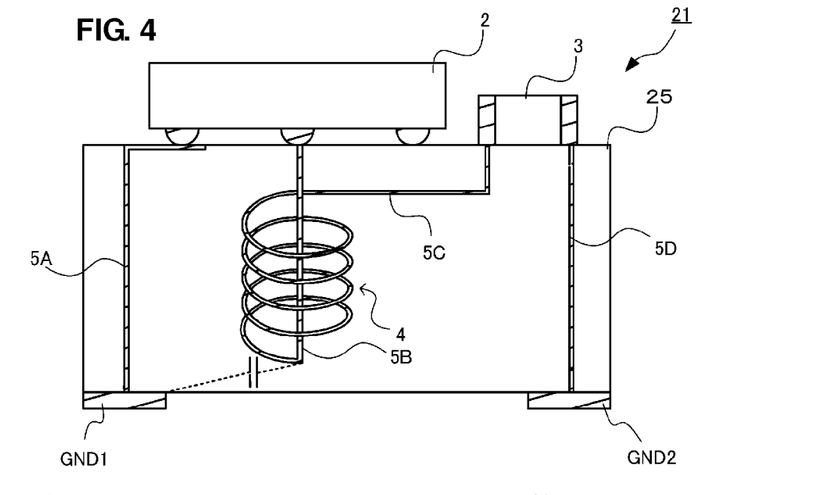
FIG. 4 is a schematic cross-sectional view of a DC-DC converter module according to a third preferred embodiment of the present invention.

FIG. 4 is schematic cross-sectional view of a DC-DC converter module 21 according to a third preferred embodiment of the present invention. Unlike the first preferred embodiment, a multi-layer substrate 25 is arranged such that a shield layer is omitted in the DC-DC converter module 21 of the present preferred embodiment. Even with this configuration, the effect of the wiring impedance of the wiring line 5A which is a common impedance for noise is suppressed and significantly reduced, and noise transmitted over the wiring line 5A is suppressed and significantly reduced, such the noise characteristics of the DC-DC converter module 21 are significantly improved.

Fourth Preferred Embodiment

Figure 5:
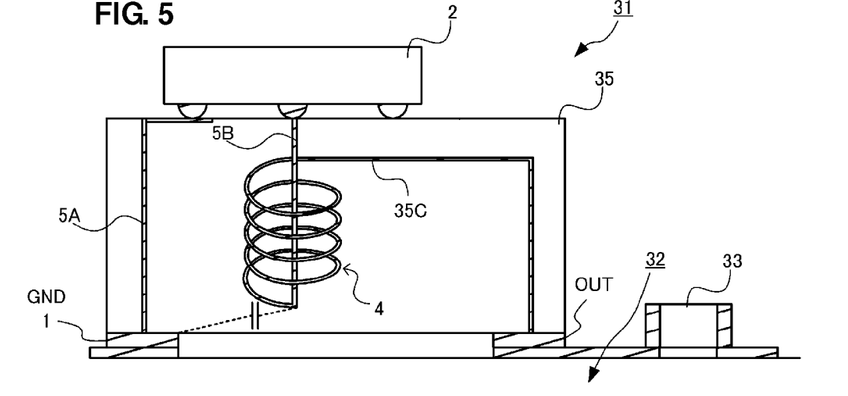
FIG. 5 is a schematic cross-sectional view of a DC-DC converter module according to a fourth preferred embodiment of the present invention.

FIG. 5 is a schematic cross-sectional view of a configuration in a state where a DC-DC converter module 31 according to a fourth preferred embodiment is mounted on a mounting board 32. Unlike the first preferred embodiment, the DC-DC converter module 31 of the present preferred embodiment is provided with a capacitor 33 arranged at a location separate from a multi-layer substrate 35.

The DC-DC converter module 31 and the capacitor 33 are mounted on the mounting board 32. The DC-DC converter module 31 includes the switching IC 2, the coil 4, and the multi-layer substrate 35. The multi-layer substrate 35 includes therein the coil 4 and wiring lines 5A, 5B, and 35C, and is provided with the input terminal IN (not illustrated), the output terminal OUT, and the ground terminal GND1 provided on the bottom surface. The wiring line 35C connects the coil 4 to the output terminal OUT, and the output terminal OUT is connected to a first end of the capacitor 33 as well as a circuit in a subsequent stage. Note that the second end of the capacitor 33 is connected to the ground potential. Also in such a configuration, the effect of the wiring impedance of the wiring line 5A which is a common impedance for noise is suppressed and significantly reduced, and noise transmitted over the wiring line 5A is suppressed and significantly reduced, such that the noise characteristics of the DC-DC converter module 31 are significantly improved.

Fifth Preferred Embodiment

Figure 6:
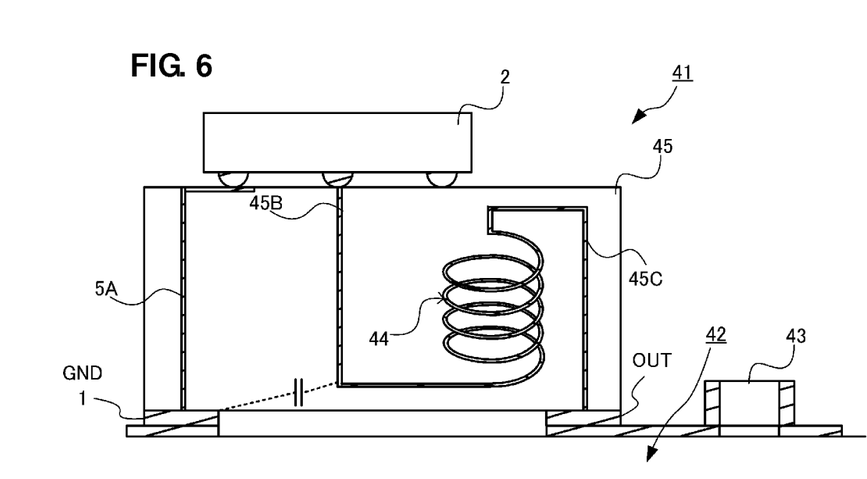
FIG. 6 is a schematic cross-sectional view of a DC-DC converter module according to a fifth preferred embodiment of the present invention.

FIG. 6 is a schematic cross-sectional view of a DC-DC converter module 41 according to a fifth preferred embodiment of the present invention. The DC-DC converter module 41 of the present preferred embodiment is different from the fourth preferred embodiment in terms of the arrangement of a coil 44 provided within a multi-layer substrate 45 and the shapes of wiring lines.

The DC-DC converter module 41 includes the multi-layer substrate 45. The multi-layer substrate 45 includes therein the coil 44 and wiring lines 5A, 45B, and 45C. The coil 44 is arranged so as not to be directly under the output electrode of the switching IC 2. The wiring line 45B extends downward in a vertical direction from the output electrode of the switching IC 2 through a via electrode, passing through positions spaced away from the coil 44, and is connected to the bottom surface side end of the coil 44 using an electrode pattern. In such a configuration, the length of the wiring line is larger than that in the case where the wiring lines 45B and 45C connected to the connection ends of the coil 44 are swapped around as in the existing configuration. However, the effect of the wiring impedance of the wiring line 5A is suppressed and significantly reduced, and noise transmitted over the wiring line 5A is suppressed and significantly reduced, such that the noise characteristics of the DC-DC converter module 41 are significantly improved.

Sixth Preferred Embodiment

Figure 7:
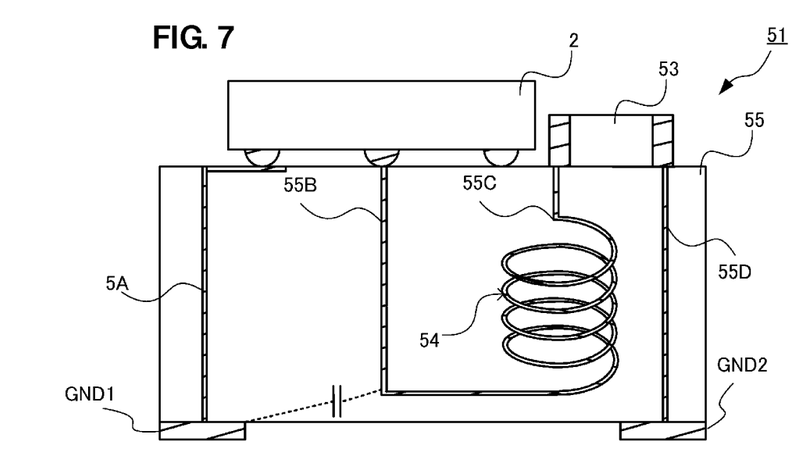
FIG. 7 is a schematic cross-sectional view of a DC-DC converter module according to a sixth preferred embodiment of the present invention.

FIG. 7 is a schematic cross-sectional view of a DC-DC converter module 51 according to a sixth preferred embodiment of the present invention. In the DC-DC converter module 51 of the present preferred embodiment, unlike the fifth preferred embodiment, a capacitor 53 is provided on the top surface of a multi-layer substrate 55, and wiring lines 55C and 55D that respectively connect the capacitor 53 to a coil 54 and the ground terminal GND2 are provided.

Also in this preferred embodiment, the effect of the wiring impedance of the wiring line 5A which is a common impedance for noise is suppressed and significantly reduced, and noise transmitted over the wiring line 5A is suppressed and significantly reduced, such that the noise characteristics of the DC-DC converter module 51 are significantly improved.

Although the present invention is realized as has been shown in the preferred embodiments described above, the specific configurations of the DC-DC converter modules can be appropriately modified within the scope of the present invention described in the claims. The operations and effects obtained by the present invention are not limited to those in the preferred embodiments described above and can be obtained by various configurations.

For example, although the capacitor preferably is a component mounted on a multi-layer substrate or a mounting board in the above-described preferred embodiments, the capacitor may be formed of wiring patterns within the multi-layer substrate.

In addition, although the multi-layer substrate preferably has a stack structure including magnetic layers, the multi-layer substrate may include only dielectric layers or have a stack structure including dielectric layers and magnetic layers.

Further, preferred embodiments of the present invention can be realized using various circuit configurations other than the circuit configuration illustrated in FIG. 2A. Usable circuit configurations include a circuit configuration in which a coil is connected to the input electrode of a switching IC or a circuit configuration in which a plurality of coils or capacitors are provided.

A preferred embodiment of the present invention can be favorably realized at least by connecting a wiring line between a coil and a switching IC to the coil on the second surface side where a ground terminal is located.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A DC-DC converter module comprising:
    a multi-layer substrate including component mounting electrodes provided on a first surface thereof in a stacking direction and an input terminal, an output terminal, and a ground terminal provided on a second surface thereof in the stacking direction;
    a switching IC that switches an input voltage and outputs a switched voltage and that includes an input electrode that is connected to the input terminal through at least one of the component mounting electrodes, an output electrode that is connected to the output terminal through at least one of the component mounting electrodes, and a ground electrode that is connected to the ground terminal through at least one of the component mounting electrodes; and
    a coil that is arranged within the multi-layer substrate in a spiral shape with an axis extending in the stacking direction, an end of the coil nearer to the first surface being connected to the input terminal or the output terminal, and an end of the coil nearer to the second surface being connected to the input electrode or the output electrode of the switching IC and extending through an inside of the multi-layer substrate.

2. The DC-DC converter module according to claim 1, wherein a shield layer including a ground electrode and that is connected to the ground terminal is provided between the first surface and layers on which the coil is provided.

3. The DC-DC converter module according to claim 1, wherein the multi-layer substrate includes a magnetic layer.

4. The DC-DC converter module according to claim 1, further comprising:
    a capacitor mounted on at least one of the component mounting electrodes; wherein
    a first end of the capacitor is connected to an end of the coil nearer to the first surface and a second end of the capacitor is connected to the ground terminal.

5. The DC-DC converter module according to claim 1, wherein
    the multi-layer substrate includes a plurality of magnetic layers stacked on each other in the stacking direction.

6. The DC-DC converter module according to claim 5, wherein
    the multi-layer substrate includes a plurality of dielectric layers stacked with the plurality of magnetic layers in the stacking direction.

7. The DC-DC converter module according to claim 1, wherein
    the multi-layer substrate includes a plurality of dielectric layers stacked on each other in the stacking direction.

8. The DC-DC converter module according to claim 1, further comprising:
    a capacitor defined by wiring patterns disposed within the multi-layer substrate; wherein
    a first end of the capacitor is connected to an end of the coil nearer to the first surface and a second end of the capacitor is connected to the ground terminal.

9. The DC-DC converter module according to claim 1, further comprising a plurality of coils or a plurality of capacitors provided in or on the multi-layer substrate.

10. The DC-DC converter module according to claim 1, further comprising a wiring line connected between the coil and the switching IC on the second surface side at which the ground terminal is located.

11. The DC-DC converter module according to claim 1, further comprising a shield layer located on the second surface of the multi-layer substrate.

12. The DC-DC converter module according to claim 1, wherein no shield layer is provided in the multi-layer substrate.

13. The DC-DC converter module according to claim 1, further comprising a capacitor located at a position spaced away from the multi-layer substrate.

14. The DC-DC converter module according to claim 1, further comprising:
    a wiring line provided in the multi-layer substrate; wherein
    the wiring line extends downward in the stacking direction from the output electrode of the switching IC, passes through portions spaced away from the coil, and is connected to the second surface side end of the coil; and
    the coil is not directly under the output electrode of the switching IC.

15. The DC-DC converter module according to claim 1, further comprising a capacitor located on a top surface of the multi-layer substrate and wiring lines arranged to connect the capacitor to the coil and the ground terminal.

16. A multi-layer substrate comprising:
- a substrate body including a first surface and a second surface;
- component mounting electrodes provided on the first surface of the substrate body;
- an input electrode, an output electrode, and a ground electrode of a switching IC mounted on the component mounting electrodes;
- an input terminal, an output terminal, and a ground terminal provided on the second surface of the substrate body;
- a coil arranged within the substrate body in a spiral shape with an axis extending in a stacking direction; wherein
- an end of the coil nearer to the first surface is connected to the input terminal or the output terminal, an end of the coil nearer to the second surface is connected to the component mounting electrode to which the input electrode or the output electrode of the switching IC is connected, and the end of the coil nearer the second surface extends through an inside of the substrate body.

17. The multi-layer substrate according to claim 16, wherein the substrate body includes a plurality of magnetic layers stacked on each other in the stacking direction.

18. The multi-layer substrate according to claim 17, wherein the substrate body includes a plurality of dielectric layers stacked with the plurality of magnetic layers in the stacking direction.

19. The multi-layer substrate according to claim 16, wherein the substrate body includes a plurality of dielectric layers stacked on each other in the stacking direction.

* * * * *